United States Patent
Suzuki et al.

(10) Patent No.: US 8,238,135 B2
(45) Date of Patent: Aug. 7, 2012

(54) MRAM UTILIZING FREE LAYER HAVING FIXED MAGNETIZATION REGIONS WITH LARGER DAMPING COEFFICIENT THAN THE SWITCHING REGION

(75) Inventors: Tetsuhiro Suzuki, Tokyo (JP); Norikazu Ohshima, Tokyo (JP); Hideaki Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 364 days.

(21) Appl. No.: 12/529,387

(22) PCT Filed: Jan. 15, 2008

(86) PCT No.: PCT/JP2008/050344
§ 371 (c)(1),
(2), (4) Date: Dec. 7, 2009

(87) PCT Pub. No.: WO2008/108108
PCT Pub. Date: Sep. 12, 2008

(65) Prior Publication Data
US 2010/0096715 A1    Apr. 22, 2010

(30) Foreign Application Priority Data

Mar. 7, 2007 (JP) ................................. 2007-056693

(51) Int. Cl.
*G11C 19/00* (2006.01)

(52) U.S. Cl. .......... 365/80; 257/421; 365/158; 365/171; 365/173

(58) Field of Classification Search .................. None
See application file for complete search history.

(56) References Cited

U.S. PATENT DOCUMENTS 6,834,005 B1    12/2004 Parkin
7,372,757 B2    5/2008  Shin et al.
7,459,737 B2 *  12/2008 Ohmori et al. ................. 257/295
7,532,504 B2    5/2009  Saito
7,663,197 B2 *  2/2010  Nagase et al. ................. 257/421
7,859,881 B2    12/2010 Iwata et al.
7,929,342 B2    4/2011  Numata et al.
7,936,627 B2    5/2011  Fukami (Continued)

FOREIGN PATENT DOCUMENTS

JP        2002208680 A    7/2002

(Continued)

OTHER PUBLICATIONS

International Search Report for PCT/JP2008/050344 mailed Apr. 22, 2008.

(Continued)

*Primary Examiner* — Alexander Sofocleous

(57) ABSTRACT

A magnetic recording layer 10 of an MRAM has a first magnetization fixed region 11, a second magnetization fixed region 12 and a magnetization switching region 13. The magnetization switching region 13 has reversible magnetization and overlaps with a pinned layer. The first magnetization fixed region 11 is connected to a first boundary B1 of the magnetization switching region 13 and its magnetization direction is fixed to a first direction. The second magnetization fixed region 12 is connected to a second boundary B2 of the magnetization switching region 13 and its magnetization direction is fixed to a second direction. Both of the first direction and the second direction are toward the magnetization switching region 13 or away from the magnetization switching region 13. The damping coefficient α in at least a portion R1, R2 of the magnetization fixed regions 11 and 12 is larger than the damping coefficient α in the magnetization switching region 13.

9 Claims, 9 Drawing Sheets

U.S. PATENT DOCUMENTS

| | | |
|---|---|---|
| 8,023,315 B2 | 9/2011 | Fukami |
| 2002/0055016 A1 | 5/2002 | Hiramoto et al. |
| 2007/0194359 A1 | 8/2007 | Lim et al. |

FOREIGN PATENT DOCUMENTS

| | | | |
|---|---|---|---|
| JP | 2005093488 A | 4/2005 | |
| JP | 2005150303 A | 6/2005 | |
| JP | 2005191032 A | 7/2005 | |
| JP | 2006073930 A | 3/2006 | |
| JP | 2006093578 A | 4/2006 | |
| JP | 2007258460 A | 10/2007 | |
| JP | 2007317895 A | 12/2007 | |
| WO | 2007020823 A | 2/2007 | |

OTHER PUBLICATIONS

K. Yagami et al., "Research Trends in Spin Transfer Magnetization Switching", Journal of The Magnetics Society of Japan, vol. 28, No. 9, 2004.

S. Mizukami et al., "The Study on Ferromagnetic Resonance Linewidth for NM/80NiFe/NM (NM=Cu, Ta, Pd and Pt) Films", Jpn. J. Appl. Phys., vol. 40, pp. 580-585, 2001.

A. Yamaguchi et al., "Real-Space Observation of Current-Driven Domain Wall Motion in Submicron Magnetic Wires", Physical Review Letters, vol.92, No. 7, pp. 077205-1-4, 2004.

H. Numata et al., "Magnetic Configuration of a New Memory Cell Utilizing Domain Wall Motion", Intermag 2006 Digest: HQ-03.

R. Scheuerlein et al., "A 10ns Read and Write Non-Volatile Memory Array Using a Magnetic Tunnel Junction and FET Switch in each Cell", 2000 IEEE International Solid State Circuits Conference, Digest of Technical Papers, pp. 128-129.

M. Durlam et al., "Nonvolatile RAM based on Magnetic Tunnel Junction Elements", 2000 IEEE International Solid-State Circuits Conference, Digest of Technical Papers, pp. 130-131.

J. Shibata et al., "Effect of Spin Current on Uniform Ferromagnetism: Domain Nucleation", Physical Review Letters, Feb. 25, 2005, vol. 94, p. 076601-1-076601-4.

* cited by examiner

MRAM UTILIZING FREE LAYER HAVING FIXED MAGNETIZATION REGIONS WITH LARGER DAMPING COEFFICIENT THAN THE SWITCHING REGION

This application is the National Phase of PCT/JP2008/050344, filed Jan. 15, 2008, which is based upon and claims the benefit of priority from Japanese patent application No. 2007-056693, filed on Mar. 7, 2007, the disclosure of which is incorporated herein in its entirely by reference.

TECHNICAL FIELD

The present invention relates to a magnetic random access memory (MRAM: Magnetic Random Access Memory). In particular, the present invention relates to a domain wall motion type MRAM.

BACKGROUND ART

An MRAM is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, a magnetic tunnel junction (MTJ: Magnetic Tunnel Junction) in which a tunnel barrier layer is sandwiched by two ferromagnetic layers is formed. The two ferromagnetic layers include a magnetization fixed layer (pinned layer) whose magnetization direction is fixed and a magnetization free layer (free layer) whose magnetization direction is reversible.

It is known that a resistance value $(R+\Delta R)$ of the MTJ when the magnetization directions of the pinned layer and the free layer are "anti-parallel" to each other becomes larger than a resistance value (R) when the magnetization directions are "parallel" to each other due to the magnetoresistance effect. The MRAM uses the magnetoresistance element having the MTJ as a memory cell and nonvolatilely stores data by utilizing the change in the resistance value. For example, the anti-parallel state is related to data "1" and the parallel state is related to data "0". Data writing to the memory cell is performed by switching the magnetization direction of the free layer.

Conventionally known methods of data writing to the MRAM include an "asteroid method" and a "toggle method". According to these write methods, a magnetic switching field necessary for switching the magnetization of the free layer increases in substantially inverse proportion to a size of the memory cell. That is to say, a write current tends to increase with the miniaturization of the memory cell.

As a write method capable of suppressing the increase in the write current with the miniaturization, there is proposed a "spin transfer method" (for example, refer to Japanese Laid-Open Patent Application JP-2005-093488 and "Yagami and Suzuki, Research Trends in Spin Transfer Magnetization Switching, Journal of The Magnetics Society of Japan, Vol. 28, No. 9, 2004). According to the spin transfer method, a spin-polarized current is injected to a ferromagnetic conductor, and direct interaction between spin of conduction electrons of the current and magnetic moment of the conductor causes the magnetization to be switched (hereinafter referred to as "Spin Transfer Magnetization Switching").

In the spin transfer method, a write current is proportional to a "damping coefficient $\alpha$" that represents strength of damping of spin precession. As a method for controlling the damping coefficient $\alpha$, to form a non-magnetic metal layer of Pt and the like adjacent to a magnetic film is reported in Mizukami et al., The Study on Ferromagnetic Resonance Linewidth for NM/80NiFe/NM (NM=Cu, Ta, Pd and Pt) Films, Jpn. J. Appl. Phys., Vol. 40, pp. 580-585, 2001. In this case, however, the damping coefficient $\alpha$ is increased as compared with a case of a single magnetic film and thus the write current is increased as well.

U.S. Pat. No. 6,834,005 discloses a magnetic shift resister that utilizes the spin transfer. The magnetic shift resister stores data by utilizing a domain wall in a magnetic body. In the magnetic body having a large number of separated regions (magnetic domains), a current is so flowed as to pass through the domain wall and the current causes the domain wall to move. The magnetization direction in each of the regions is treated as a record data. For example, such a magnetic shift resister is used for recording large quantities of serial data. It should be noted that the domain wall motion in a magnetic body is reported also in Yamaguchi et al., Real-Space Observation of Current-Driven Domain Wall Motion in Submicron Magnetic Wires, PRL, Vol. 92, pp. 077205-1-4, 2004.

A "domain wall motion type MRAM" that utilizes the domain wall motion due to the spin transfer is described in Japanese Laid-Open Patent Application JP-2005-191032, International Publication WO/2007/020823 and Numata et al., Magnetic Configuration of A New Memory Cell Utilizing Domain Wall Motion, Intermag 2006 Digest, HQ-03.

An MRAM described in Japanese Laid-Open Patent Application JP-2005-191032 is provided with a magnetization fixed layer whose magnetization is fixed, a tunnel insulating layer laminated on the magnetization fixed layer, and a magnetization free layer laminated on the tunnel insulating layer. FIG. 1 shows a structure of the magnetization free layer. In FIG. 1, the magnetization free layer 100 has a linear shape. More specifically, the magnetization free layer 100 has a connector section 103 overlapping with the tunnel insulating layer and the magnetization fixed layer, constricted sections 104 adjacent to both ends of the connector section 103, and a pair of magnetization fixed sections 101 and 102 respectively formed adjacent to the constricted sections 104. The magnetization fixed sections 101 and 102 are respectively provided with fixed magnetizations whose directions are opposite to each other. The MRAM is further provided with a pair of write terminals 105 and 106 electrically connected to the pair of magnetization fixed sections 101 and 102. By using the write terminals 105 and 106, a current penetrating through the connector section 103, the pair of constricted sections 104 and the pair of magnetization fixed sections 101 and 102 in the magnetization free layer 100 is flowed.

FIG. 2 shows a structure of a magnetic recording layer 110 of a magnetic memory cell described in International Publication WO/2007/020823. The magnetic recording layer 110 has a U-shape. More specifically, the magnetic recording layer 110 has a first magnetization fixed region 111, a second magnetization fixed region 112 and a magnetization switching region 113. The magnetization switching region 113 overlaps with a pinned layer 130. The magnetization fixed regions 111 and 112 are so formed as to extend in a Y direction, and the magnetization directions thereof are fixed to the same direction. On the other hand, the magnetization switching region 113 is so formed as to extend in a X direction and has reversible magnetization. Therefore, a domain wall is formed at a boundary B1 between the first magnetization fixed region 111 and the magnetization switching region 113 or at a boundary B2 between the second magnetization fixed region 112 and the magnetization switching region 113.

The magnetization fixed regions 111 and 112 are connected to current supply terminals 115 and 116, respectively.

By using these current supply terminals 115 and 116, it is possible to flow a write current in the magnetic recording layer 110. The domain wall moves within the magnetization switching region 113 depending on a direction of the write current. The magnetization direction of the magnetization switching region 113 can be controlled by the domain wall motion.

DISCLOSURE OF INVENTION

The inventors of the present application have recognized the following points. Regarding the domain wall motion type MRAM shown in FIGS. 1 and 2, the domain wall dynamics is expressed by the following equation (1). In the equation, $\alpha$ is the damping coefficient, q is a position of the domain wall, $\Psi$ is a rise angle of the magnetization with respect to plane, Ms is saturation magnetization, $\gamma$ is a gyro magnetic constant, $\Delta$ is a domain wall width, $\epsilon$ is a pinning potential, Hk is an anisotropy magnetic field, u is a current density, and $\beta$ is a non-adiabatic constant.

$$(1+\alpha^2)\dot{q} = -\frac{\alpha\gamma\Delta}{2M_s}\left(\frac{\partial\varepsilon}{\partial q}\right) + \frac{\gamma\Delta}{2}H_k\sin(2\Psi) + (1+\alpha\beta)u \quad (1)$$

$$(1+\alpha^2)\dot{\Psi} = -\frac{\gamma}{2M_s}\left(\frac{\partial\varepsilon}{\partial q}\right) - \frac{\gamma\alpha}{2}H_k\sin(2\Psi) + (\beta-\alpha)\frac{u}{\Delta}$$

According to the above equation (1), the domain wall behaves as if it was a particle in a potential. Conceptually, the pinning potential is as shown in FIG. 3, although a size and a shape thereof vary depending on the constricted section 104 in the case of FIG. 1 and connection between the magnetization fixed regions 111, 112 and the magnetization switching region 113 in the case of FIG. 2. Due to application of the spin-polarized write current, the domain wall goes up the potential to transit across barrier.

However, if the write current is increased above a certain level, a large amount of energy is stored in the domain wall. Therefore, when the write current is turned off, the domain wall may return back due to rebound as shown in FIG. 4. Moreover, let us consider a case shown in FIG. 5 where the write current is applied in the opposite direction of a direction required for transition from the "0" state to the "1" state. Also in this case, a large amount of energy is stored in the domain wall and thus the domain wall may transit to the "1" state due to rebound.

As described above, erroneous write may occur in the domain wall motion type MRAM. In order to suppress the erroneous write, a margin of the write current needs to be narrowed.

An object of the present invention is to provide a technique that can enlarge the margin of the write current in the domain wall motion type MRAM.

According to an exemplary embodiment of the present invention, a domain wall motion type MRAM is provided. The MRAM has: a magnetic recording layer that is a ferromagnetic layer; and a pinned layer connected to the magnetic recording layer through a non-magnetic layer. The magnetic recording layer includes: a magnetization switching region having reversible magnetization and overlapping with the pinned layer; a first magnetization fixed region connected to a first boundary of the magnetization switching region and whose magnetization direction is fixed to a first direction; and a second magnetization fixed region connected to a second boundary of the magnetization switching region and whose magnetization direction is fixed to a second direction. Both of the first direction and the second direction are toward the magnetization switching region or away from the magnetization switching region. A domain wall moves in the magnetization switching region due to a current flowing between the first magnetization fixed region and the second magnetization fixed region. The damping coefficient in at least a portion of the first magnetization fixed region and the second magnetization fixed region is larger than the damping coefficient in the magnetization switching region.

According to another exemplary embodiment of the present invention, a domain wall motion type MRAM is provided. The MRAM has: a magnetic recording layer that is a ferromagnetic layer; and a pinned layer connected to the magnetic recording layer through a non-magnetic layer. The magnetic recording layer includes: a magnetization switching region having reversible magnetization and overlapping with the pinned layer; a first magnetization fixed region whose magnetization direction is fixed to a first direction; a second magnetization fixed region whose magnetization direction is fixed to a second direction; a first damping region provided between a first boundary of the magnetization switching region and the first magnetization fixed region; and a second damping region provided between a second boundary of the magnetization switching region and the second magnetization fixed region. Both of the first direction and the second direction are toward the magnetization switching region or away from the magnetization switching region. The damping coefficient in the first damping region and the second damping region is larger than the damping coefficient in the magnetization switching region.

When the domain wall intrudes into the first magnetization fixed region or the second magnetization fixed region due to application of the write current, rapid energy dissipation occurs at the portion where the damping coefficient is large. As a result, the domain wall cannot get over the potential barrier after the write current is turned off. That is to say, the erroneous write as shown in FIGS. 4 and 5 hardly occur. Consequently, degree of freedom for designing the write current is improved, which makes it possible to enlarge the margin of the write current.

According to the present invention, it is possible to reduce risk of the erroneous write in the domain wall motion type MRAM. As a result, degree of freedom for designing the write current is improved, which makes it possible to enlarge the margin of the write current.

BEST MODE FOR CARRYING OUT THE INVENTION

An MRAM according to an exemplary embodiment of the present invention will be described below with reference to the attached drawings. The MRAM according to the present exemplary embodiment MRAM is a domain wall motion type MRAM.

1. Structure of Magnetic Memory Cell 1-1. Basic Structure

Figure 6:
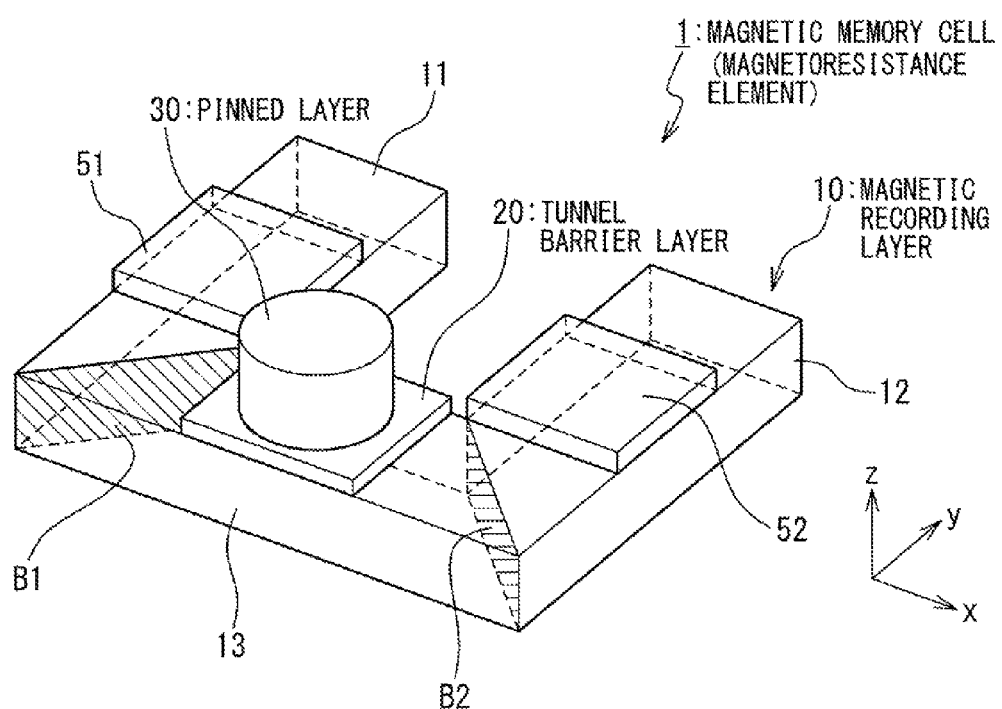
FIG. 6 is an overall view showing one example of a structure of a magnetic memory cell according to an exemplary embodiment of the present invention.

FIG. 6 shows an example of a magnetic memory cell 1 (magnetoresistance element) according to the present exemplary embodiment. The magnetic memory cell 1 is provided with a magnetic recording layer 10 and a pinned layer 30 that are ferromagnetic layers and a tunnel barrier layer 20 that is a non-magnetic layer. The tunnel barrier layer 20 is sandwiched between the magnetic recording layer 10 and the pinned layer 30, and the magnetic recording layer 10, the tunnel barrier layer 20 and the pinned layer 30 form a magnetic tunnel junction (MTJ).

Material of the magnetic recording layer 10 is exemplified by NiFe, alloy of NiFe and Cu, Ta or the like, alloy including Ni, Fe and Co, amorphous magnetic material composed mostly of CoFeB, and the like. The tunnel barrier layer 20 is a thin insulating film such as an Al2O3 film, an MgO film and the like. Material of the pinned layer 30 is exemplified by CoFe, CoFeB and the like.

Magnetization direction of the pinned layer 30 is fixed by an anti-ferromagnetic layer not shown. On the other hand, the magnetic recording layer 10 has reversible magnetization and plays a role corresponding to a magnetization free layer (free layer).

As shown in FIG. 6, the magnetic recording layer 10 according to the present exemplary embodiment includes a first magnetization fixed region 11, a second magnetization fixed region 12 and a magnetization switching region 13. The magnetization switching region 13 is so formed as to extend in the X direction and has reversible magnetization. The magnetization switching region 13 is so formed as to overlap with the pinned layer 30. In other words, a part of the magnetization switching region 13 of the magnetic recording layer 10 is connected to the pinned layer 30 through the tunnel barrier layer 20.

The first magnetization fixed region 11 is so formed as to extend in the Y direction, and magnetization direction thereof is fixed. Similarly, the second magnetization fixed region 12 is so formed as to extend in the Y direction, and magnetization direction thereof is fixed. The magnetizations of the magnetization fixed regions 11 and 12 may be fixed by adjacent anti-ferromagnet. It should be noted that "magnetization being fixed" means that the magnetization direction does not change before and after a write operation. Even if the magnetization direction of a part of the magnetization fixed region is changed during the write operation, it returns back after the write operation is completed.

Figure 7:
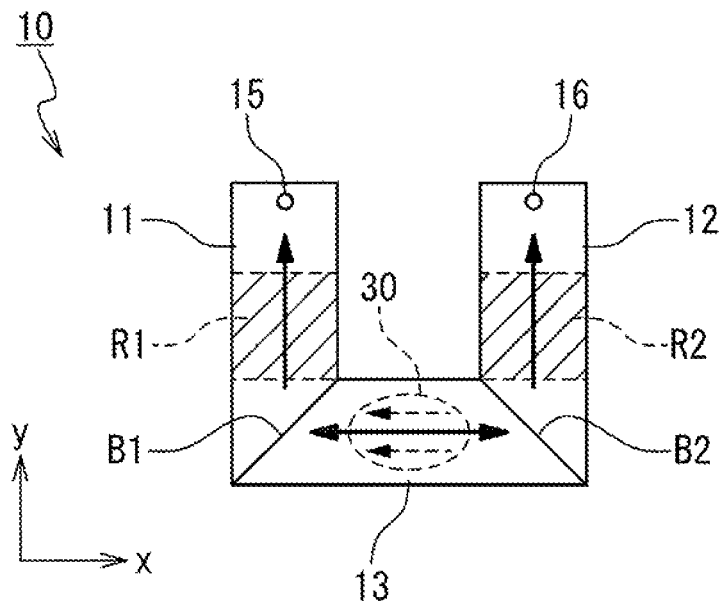
FIG. 7 is a plan view showing one example of a structure of a magnetic recording layer according to the exemplary embodiment of the present invention.

The magnetization fixed regions 11 and 12 and the magnetization switching region 13 are formed in the same plane (i.e. XY plane). A shape of the magnetic recording layer 10 in the XY plane is shown in FIG. 7. As shown in FIG. 7, the magnetization fixed regions 11 and 12 and the magnetization switching region 13 are formed to have a "U-shape or concave shape". More specifically, the magnetization fixed regions 11 and 12 are so formed along the Y direction as to be substantially parallel to each other. The magnetization switching region 13 is so formed along the X direction as to connect between the magnetization fixed regions 11 and 12. The first magnetization fixed region 11 and the magnetization switching region 13 are in contact with each other at a first boundary B1, while the second magnetization fixed region 12 and the magnetization switching region 13 are in contact with each other at a second boundary B2. In the magnetization switching region 13, the first boundary 81 and the second boundary B2 are at opposed positions. Moreover, a current supply terminal 15 is provided near an edge of the first magnetization fixed region 11 opposed to the first boundary B1. A current supply terminal 16 is provided near an edge of the second magnetization fixed region 12 opposed to the second boundary B2.

The magnetization direction in each region is also indicated by an arrow in FIG. 7. Moreover, projection of the pinned layer 30 and the magnetization direction thereof are also indicated by a dotted line and a dotted arrow, respectively. Let us consider a case where the magnetization direction of the pinned layer 30 is fixed to the −X direction. In FIG. 7, the magnetization direction of the first magnetization fixed region 11 is fixed to the +Y direction. The direction is the one away from the first boundary B1. Also, the magnetization direction of the second magnetization fixed region 12 is fixed to the +Y direction. The direction is the one away from the second boundary B2. That is to say, the magnetization fixed regions 11 and 12 both are formed such that the magnetization directions thereof are away from the magnetization switching region 13. This means that the magnetization directions of the magnetization fixed regions 11 and 12 are opposite along the shape of the magnetic recording layer 10.

On the other hand, the magnetization direction of the magnetization switching region 13 is reversible, and can be either the +X direction or the −X direction. In other words, the magnetization of the magnetization switching region 13 is allowed to be parallel or anti-parallel to the magnetization of the pinned layer 30. In a case where the magnetization direction of the magnetization switching region 13 is the +X direction, namely, the magnetization is directed toward the second boundary B2, the first magnetization fixed region 11 forms one magnetic domain while the magnetization switching region 13 and the second magnetization fixed region 12 form another magnetic domain. In this case, a domain wall is formed at the first boundary B1. On the other hand, in a case where the magnetization direction of the magnetization switching region 13 is the −X direction, namely, the magnetization is directed toward the first boundary B1, the first magnetization fixed region 11 and the magnetization switching region 13 form one magnetic domain while the second magnetization fixed region 12 forms another magnetic domain. In this case, the domain wall is formed at the second boundary B2.

As described above, the magnetization of the magnetization switching region 13 is directed to either the first boundary B1 or the second boundary B2, and the domain wall is formed at either the first boundary B1 or the second boundary B2 in the magnetic recording layer 10. This is because the magnetization directions of the magnetization fixed regions 11 and 12 are opposite along the shape of the magnetic recording layer 10.

Figure 8:
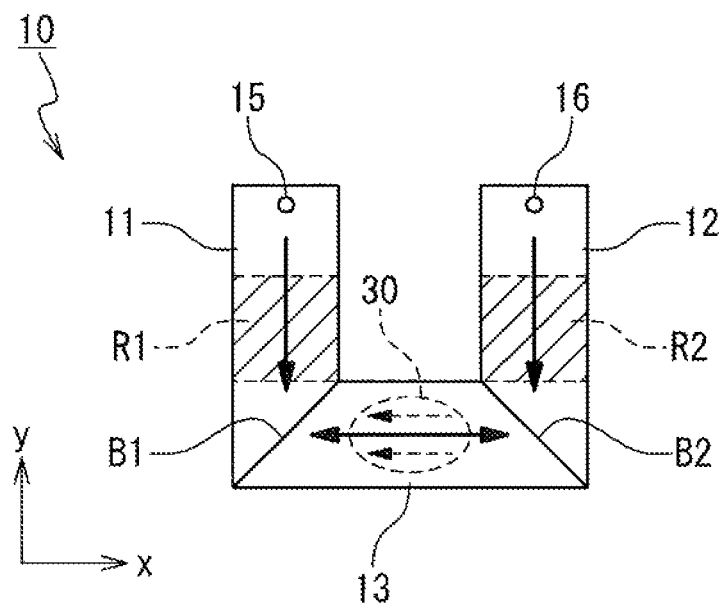
FIG. 8 is a plan view showing another example of a structure of the magnetic recording layer according to the exemplary embodiment of the present invention.

The magnetization directions of the magnetization fixed regions 11 and 12 are not limited to those shown in FIG. 7. As mentioned above, the magnetization directions of the magnetization fixed regions 11 and 12 just need to be opposite along the shape of the magnetic recording layer 10. In FIG. 8, for example, the magnetization direction of the first magnetization fixed region 11 is fixed to the −Y direction. The direction is the one toward the first boundary B1. Also, the magnetization direction of the second magnetization fixed region 12 is also fixed to the −Y direction. The direction is the one toward the second boundary B2. That is to say, the magnetizations of the magnetization fixed regions 11 and 12 are both fixed to a direction toward the magnetization switching region 13 and are opposite along the shape of the magnetic recording layer 10.

1-2. Damping Region

Referring to FIG. 6 again, the magnetic memory cell 1 according to the present exemplary embodiment is further provided with non-magnetic metal layers 51 and 52. The non-magnetic metal layer 51 is provided adjacent to at least a portion of the first magnetization fixed region 11 of the magnetic recording layer 10. The non-magnetic metal layer 52 is provided adjacent to at least a portion of the second magnetization fixed region 12 of the magnetic recording layer 10. The non-magnetic metal layers 51 and 52 may be respectively in contact with the magnetization fixed regions 11 and 12 or may be respectively connected to the magnetization fixed regions 11 and 12 through a Cu layer or a Ta layer. Material of the non-magnetic metal layers 51 and 52 is exemplified by Pt, Pd and the like. The non-magnetic metal layers 51 and 52 may be formed of at least any of Pt and Pd.

In FIGS. 7 and 8, regions being adjacent to the non-magnetic metal layers 51 and 52 are indicated by R1 and R2, respectively. There regions R1 and R2 are hereinafter referred to as a first damping region R1 and a second damping region R2. The first damping region R1 is included in the first magnetization fixed region 11, and the second damping region R2 is included in the second magnetization fixed region 12. It can be said that the magnetic recording layer 10 according to the present exemplary embodiment has the damping regions R1 and R2 in addition to the magnetization fixed regions 11 and 12 and the magnetization switching region 13.

Due to the above-mentioned adjacent non-magnetic metal layers 51 and 52, the damping coefficient α in the damping regions R1 and R2 become larger than the damping coefficient α in another region. In particular, the damping coefficient α in the damping regions R1 and R2 is larger than the damping coefficient α in the magnetization switching region 13. In other words, the damping coefficient α in at least a portion (R1, R2) of the magnetization fixed regions 11 and 12 is larger than the damping coefficient α in the magnetization switching region 13. The damping coefficient α represents strength of damping of spin precession. That is to say, the damping coefficient α represents strength of damping of the domain wall motion. Energy dissipation is large and hence the domain wall motion is suppressed (braked) at the portion where the damping coefficient α is large.

It should be noted that a method for forming the damping regions R1 and R2 is not limited to the setting of the non-magnetic metal layers 51 and 52. For example, the damping regions R1 and R2 can be formed by injecting ions of such as Pt, Pd and B into the magnetization fixed regions 11 and 12.

2. Domain Wall Motion

Next, a principle of data writing for the magnetic memory cell 1 will be described below. The data writing is achieved by the domain wall motion method utilizing the spin transfer. A write current is flowed not in a direction penetrating through the MTJ but planarly in the magnetic recording layer 10. The write current is supplied to the magnetic recording layer 10 from the above-mentioned current supply terminals 15 and 16.

Figure 9:
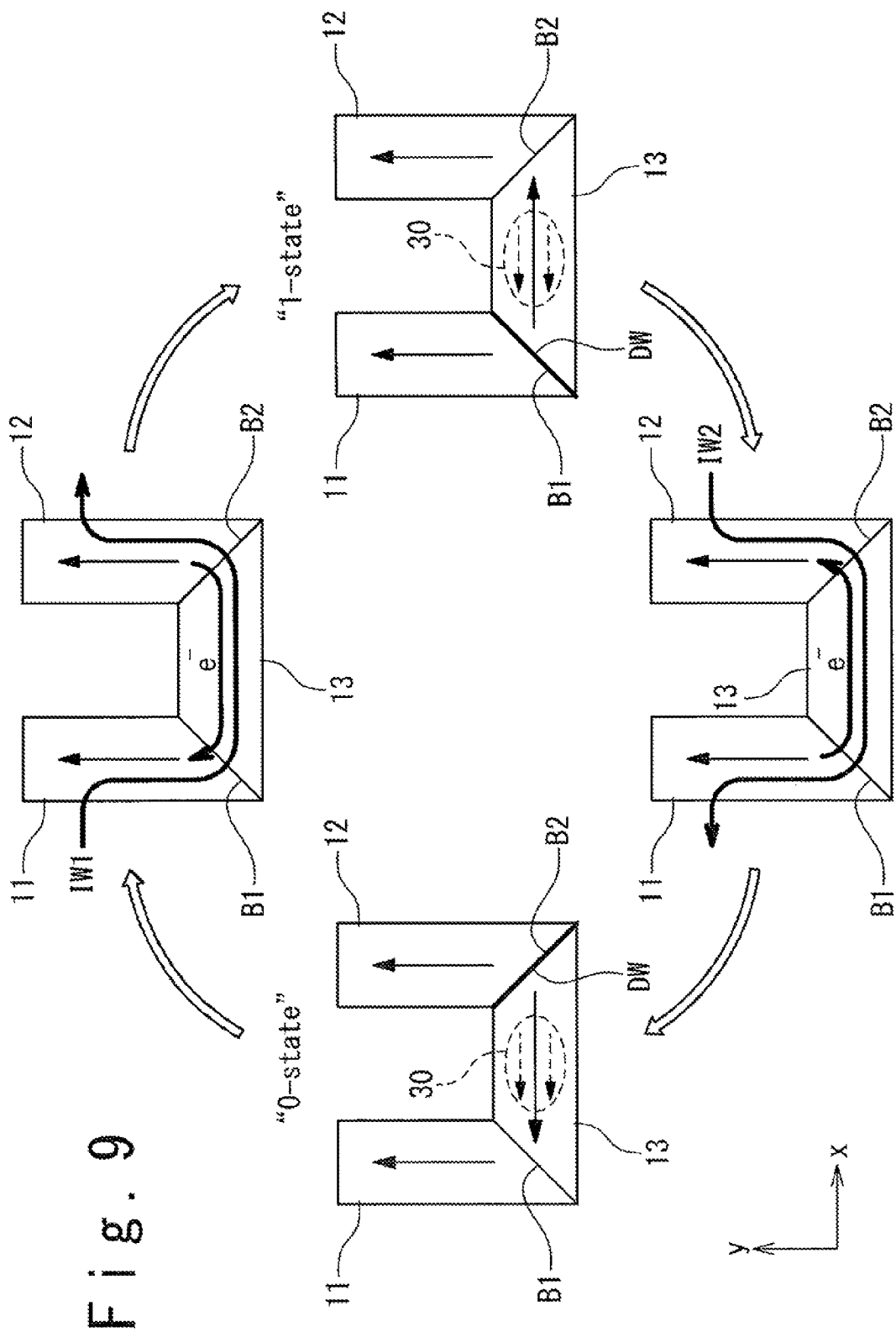
FIG. 9 is a plan view showing a principle of data writing for the magnetic memory cell according to the exemplary embodiment of the present invention.

FIG. 9 shows a principle of data writing for the structure shown in FIG. 7. A state in which the magnetization directions of the magnetization switching region 13 and the pinned layer 30 are parallel to each other is related to data "0". In the data "0" state, the magnetization direction of the magnetization switching region 13 is the −X direction, and the domain wall DW exists at the second boundary B2. On the other hand, a state in which the magnetization directions of the magnetization switching region 13 and the pinned layer 30 are anti-parallel to each other is related to data "1". In the data "1" state, the magnetization direction of the magnetization switching region 13 is the +X direction, and the domain wall DW exists at the first boundary B1.

At a time of writing the data "1", a first write current IW1 is flowed from the first magnetization fixed region 11 to the second magnetization fixed region 12 through the magnetization switching region 13. In this case, spin electrons are injected from the second magnetization fixed region 12 into the magnetization switching region 13. The spin of the injected electrons affects a magnetic moment of the magnetization switching region 13. As a result, the magnetization direction of the magnetization switching region 13 is switched to a direction toward the second boundary B2. That is to say, the magnetization of the magnetization switching region 13 is reversed due to the spin transfer effect and the magnetization direction thereof is changed to the +X direction.

On the other hand, at a time of writing the data "0", a second write current IW2 is flowed from the second magnetization fixed region 12 to the first magnetization fixed region 11 through the magnetization switching region 13. In this case, spin electrons are injected from the first magnetization fixed region 11 into the magnetization switching region 13. As a result, the magnetization of the magnetization switching region 13 is reversed and the magnetization direction thereof is changed to the −X direction. In this manner, the magnetization direction of the magnetization switching region 13 is switched by the write currents IW1 and IW2 which flows planarly in the magnetic recording layer 10. The first magnetization fixed region 11 and the second magnetization fixed region 12 serve as supply sources of the electrons having different spins.

The aforementioned write operation can also be described from a viewpoint of "domain wall motion". At the time of writing the data "1", electrons move from the second magnetization fixed region 12 toward the first magnetization fixed region 11. At this time, the domain wall DW moves from the second boundary B2 to the first boundary B1 in accordance with the electron moving direction. On the other hand, at the time of writing the data "0", electrons move from the first magnetization fixed region 11 toward the second magnetization fixed region 12. At this time, the domain wall DW moves from the first boundary B1 to the second boundary B2 in accordance with the electron moving direction. That is to say, the domain wall DW in the magnetic recording layer 10 moves back and forth within the magnetization switching region 13 in accordance with the electron moving direction. It can also be said that the magnetic memory cell 1 stores data on the basis of the position of the domain wail DW.

A data read operation is as follows. At the time of data reading, a read current is so supplied as to flow between the pinned layer 30 and the magnetization switching region 13. For example, the read current is flowed from any of the magnetization fixed regions 11 and 12 to the pinned layer 30 through the magnetization switching region 13 and the tunnel barrier layer 20. Alternatively, the read current is flowed from the pinned layer 30 to any of the magnetization fixed regions 11 and 12 through the tunnel barrier layer 20 and the magnetization switching region 13. Based on the read current or a read potential, a resistance value of the magnetoresistance element is detected and the magnetization direction of the magnetization switching region 13 is sensed.

3. Action and Effect of Damping Regions R1, R2

The domain wall motion in the present exemplary embodiment will be described below in further detail to explain actions and effects of the damping regions R1 and R2.

Figure 10:
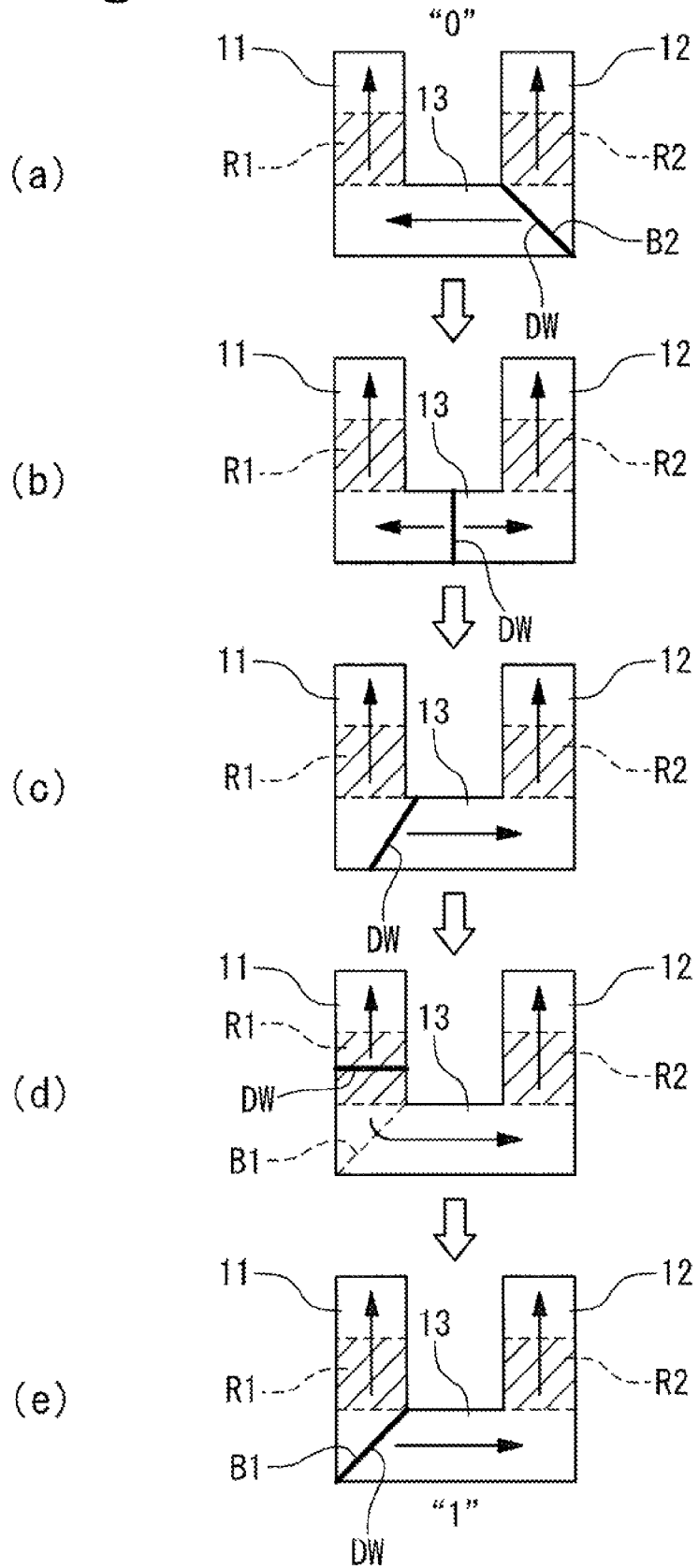
FIG. 10 is a conceptual diagram for explaining action of a damping region in the exemplary embodiment of the present invention.

FIG. 10 conceptually shows one example of the domain wall motion in the present exemplary embodiment. In FIG. 10, a state (a) represents an initial state. The initial state is the data "0" state and the domain wall DW exists at the second boundary B2. At the time of the transition from the data "0" state to the data "1" state, the first write current IW1 is flowed as mentioned above. Consequently, the domain wall DW moves toward the first magnetization fixed region 11 through the magnetization switching region 13 (states (b), (c)).

Figure 1:
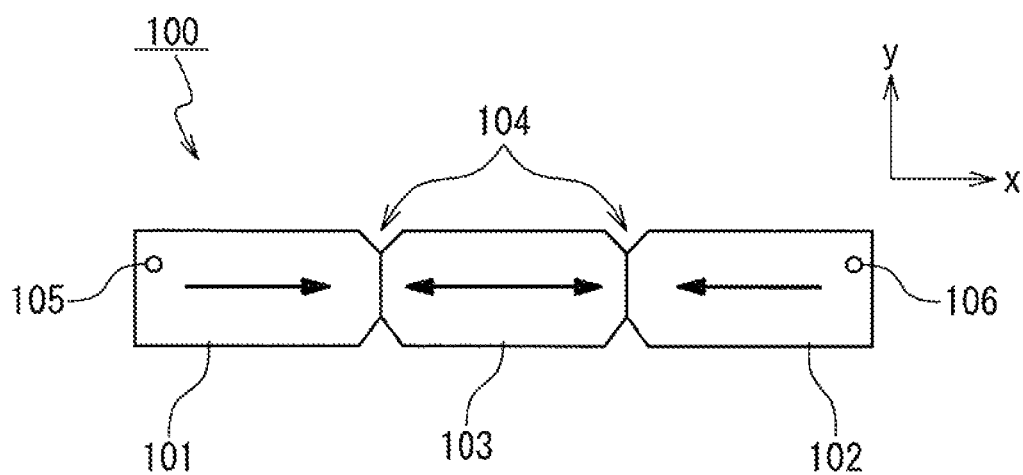
FIG. 1 is a plan view showing a structure of a magnetization free layer of a magnetic memory cell described in a related document.
Figure 2:
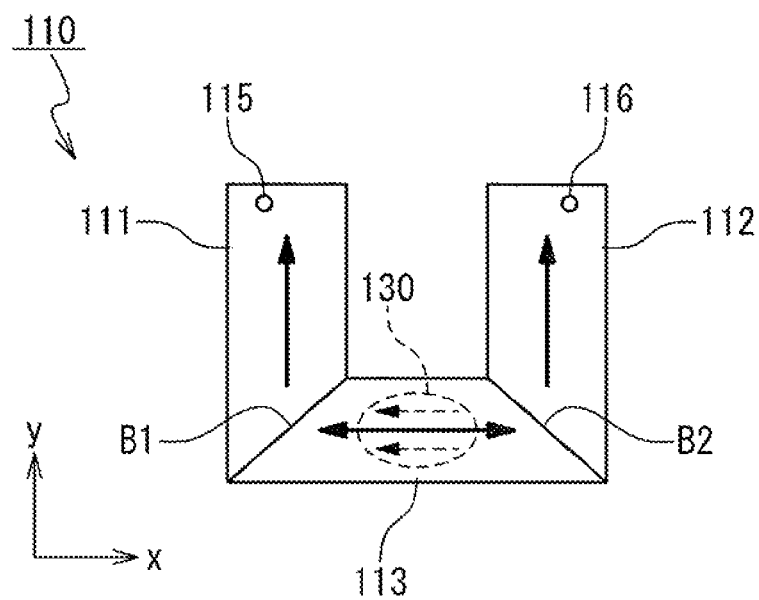
FIG. 2 is a plan view showing a structure of a magnetic recording layer of a magnetic memory cell described in another related document.
Figure 3:
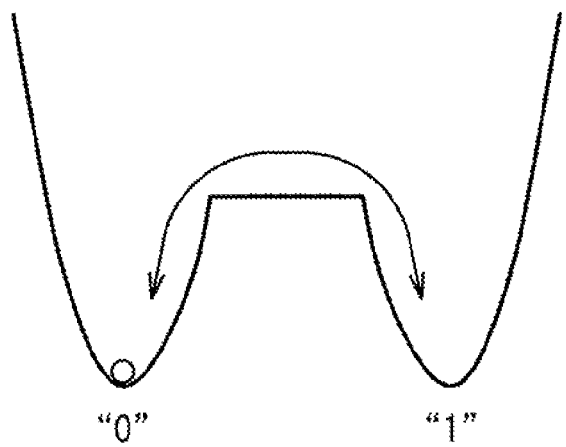
FIG. 3 is a schematic view showing pinning potential with regard to domain wall motion.

Furthermore, the domain wall DW crosses over the first boundary B1 to intrude into the first magnetization fixed region 11. The first damping region R1 exists within the first magnetization fixed region 11. When the domain wall DW intrudes into the first damping region R1 as shown in a state (d), the energy dissipation occurs fiercely. As a result, momentum of the domain wall DW is lost. When the supply of the first write current IW1 is stopped, the domain wall DW performs a damped oscillation to be settled at the first boundary B1 (state (e)). In the schematic view of FIG. 3, the first boundary B1 corresponds to the bottom of potential where the domain wall DW is most stabilized. The state (e) where the domain wall DW is settled at the first boundary B1 is the data "1" state.

In this manner, the domain wall DW loses its momentum in the first damping region R1 even if it crosses over the first boundary B1. As a result, the domain wall DW cannot get over the potential barrier after the first write current IW1 is turned off. That is to say, the domain wall DW is prevented from returning back to the initial state due to rebound (see FIG. 4). Thus, the erroneous write is prevented.

Figure 11:
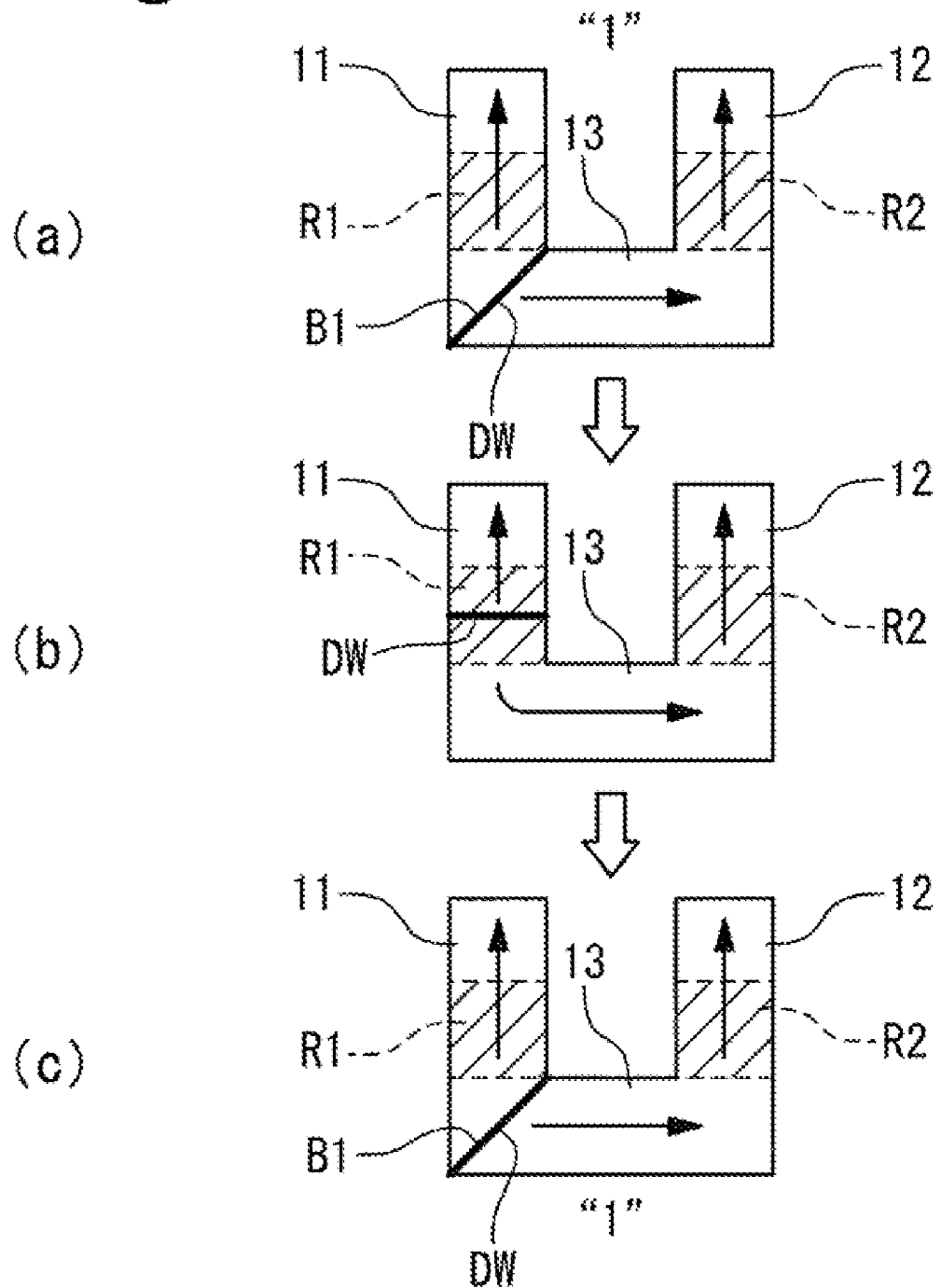
FIG. 11 is a conceptual diagram for explaining action of the damping region in the exemplary embodiment of the present invention.

FIG. 11 conceptually shows another example of the domain wall motion. In FIG. 11, a state (a) represents an initial state. The initial state is the data "1" state and the domain wall DW exists at the first boundary B1. Let us consider a case where the first write current IW1 for the data "1" writing is flowed further from this data "1" state.

In this case, the domain wall DW intrudes into the first magnetization fixed region 11 from the first boundary B1. When the domain wall DW intrudes into the first damping region R1 as shown in a state (b), the energy dissipation occurs fiercely and thus momentum of the domain wall DW is lost. Therefore, when the supply of the first write current IW1 is stopped, the domain wall DW is settled at the first boundary B1 without getting over the potential barrier (state (c)), as in the case of FIG. 10. That is to say, the data "1" state is maintained after the write operation. Thus, the erroneous write is prevented.

In general, it is unknown whether a state prior to the write operation is the "0" state or the "1" state. Therefore, it may be considered to execute a preliminary read operation prior to a write operation and then perform the write operation depending on a result of the read operation. In this case, however, a writing time as a whole is increased by the preliminary read operation. It is preferable from a viewpoint of an operation speed to execute a write operation without performing the preliminary read operation. However, the data "1" write operation may be performed with respect to a cell of data "1" as shown in FIG. 11. According to the conventional technique, the erroneous write may be caused due to the rebound (see FIG. 5). According to the present exemplary embodiment, on the other hand, such an erroneous write is prevented as shown in FIG. 11. That is to say, an intended data state can be obtained irrespective of a state prior to the writing.

Figure 4:
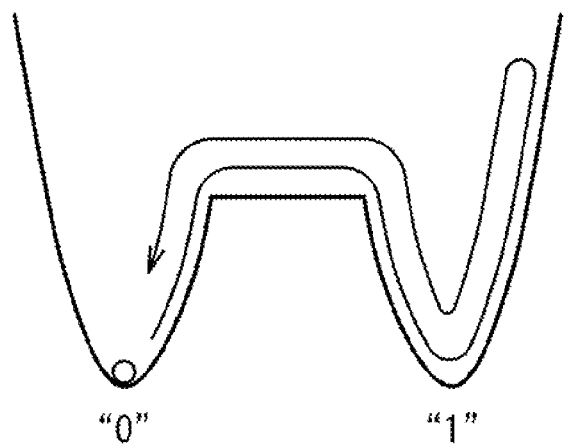
FIG. 4 is a schematic view showing one example of domain wall motion.
Figure 5:
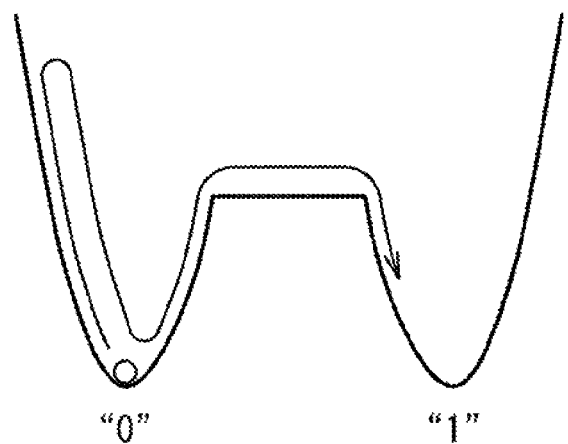
FIG. 5 is a schematic view showing another example of domain wall motion.

As described above, the domain wall DW loses its momentum by the damping regions R1 and R2 where the damping coefficient α is large. Even if the domain wall DW intrudes into the magnetization fixed region 11 or 12, rapid energy dissipation occurs in the damping region R1 or R2. As a result, the domain wall DW cannot get over the potential barrier after the write current is turned off. That is to say, risk of the erroneous write as shown in FIGS. 4 and 5 is reduced. As a result, degree of freedom for designing the write current is improved, which makes it possible to enlarge the margin of the write current.

In order to dissipate the energy of the domain wall DW in an early stage, it is desirable to provide the damping regions R1 and R2 near the boundaries B1 and B2. Preferably, the first damping region R1 is so provided as to be in contact with the first boundary B1 and the second damping region R2 is so provided as to be in contact with the second boundary B2. Consequently, it is possible to efficiently dissipate the energy of the domain wall DW.

Furthermore, according to the present exemplary embodiment, the damping coefficient α in the damping regions R1 and R2 is larger than the damping coefficient α in the magnetization switching region 13. In other words, the damping coefficient α in the magnetization switching region 13 is set to a relatively small value. The data transition is caused by the motion of the domain wall DW in the magnetization switching region 13 between the magnetization fixed regions 11 and 12. According to the present exemplary embodiment, the data transition itself is likely to occur, because the damping force with respect to the domain wall DW is weak in the magnetization switching region 13. Therefore, the write currents IW1 and IW2 required for the magnetization switching are prevented from increasing. Also, a time required for the magnetization switching is prevented from increasing.

Moreover, the damping regions R1 and R2 prevent the domain wall DW from penetrating through the magnetization fixed regions 11 and 12 to disappear.

4. Modification Examples

Figure 12:
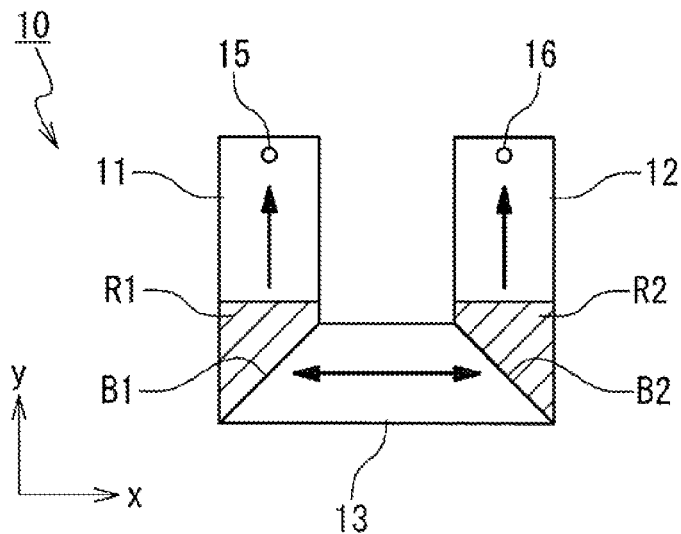
FIG. 12 is a plan view showing a modification example of a structure of the magnetic recording layer.

FIG. 12 shows a modification example of the magnetic recording layer 10. In FIG. 12, the first damping region R1 is provided between the first magnetization fixed region 11 and the first boundary B1 of the magnetization switching region 13. In other words, the first damping region R1 is provided separately from the first magnetization fixed region 11. The first magnetization fixed region 11 is connected to the magnetization switching region 13 through the first damping region R1. Also, the second damping region R2 is provided between the second magnetization fixed region 12 and the second boundary B2 of the magnetization switching region 13. In other words, the second damping region R2 is provided separately from the second magnetization fixed region 12. The second magnetization fixed region 12 is connected to the magnetization switching region 13 through the second damping region R2. The same effects can be obtained by this structure as well.

Figure 13:
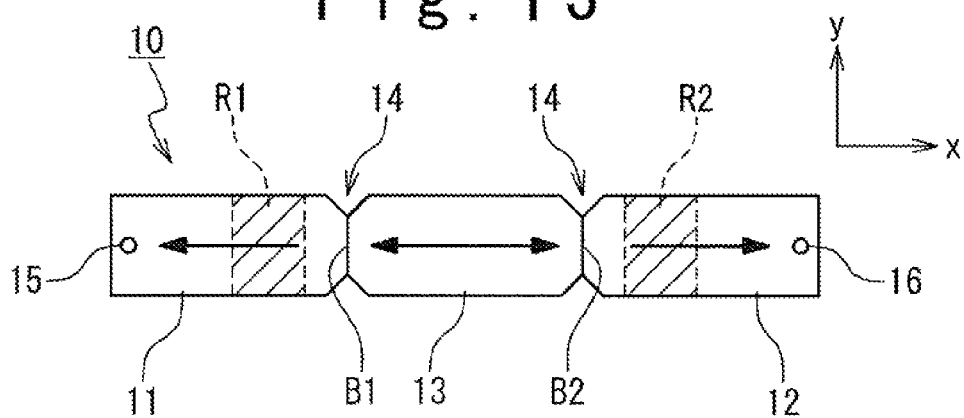
FIG. 13 is a plan view showing another modification example of a structure of the magnetic recording layer.

FIG. 13 shows another modification example of the magnetic recording layer 10. In FIG. 13, the magnetization fixed regions 11 and 12 and the magnetization switching region 13 are "linearly" formed. That is to say, the magnetization fixed regions 11 and 12 are so formed along the X direction as to be substantially parallel to each other. The magnetization switching region 13 is so formed along the X direction as to connect between the magnetization fixed regions 11 and 12. The magnetization direction of the first magnetization fixed region 11 is fixed to the −X direction, while the magnetization direction of the second magnetization fixed region 12 is fixed to the +X direction. That is to say, the magnetizations of the magnetization fixed regions 11 and 12 are both fixed to directions away from the magnetization switching region 13 and are opposite to each other. The first damping region R1 is formed at least a part of the first magnetization fixed region 11. The second damping region R2 is formed at least a part of the second magnetization fixed region 12. The same effects can be obtained by this structure as well. Note that a notch 14 is formed on a side of the magnetic recording layer 10 and an area at each boundary B1, B2 is smaller than that of the other portion. As a result, the domain wall DW can be held stably. It should be noted that the magnetizations of the magnetization fixed regions 11 and 12 may be fixed to the opposite directions as compared with the case of FIG. 13.

Figure 14:
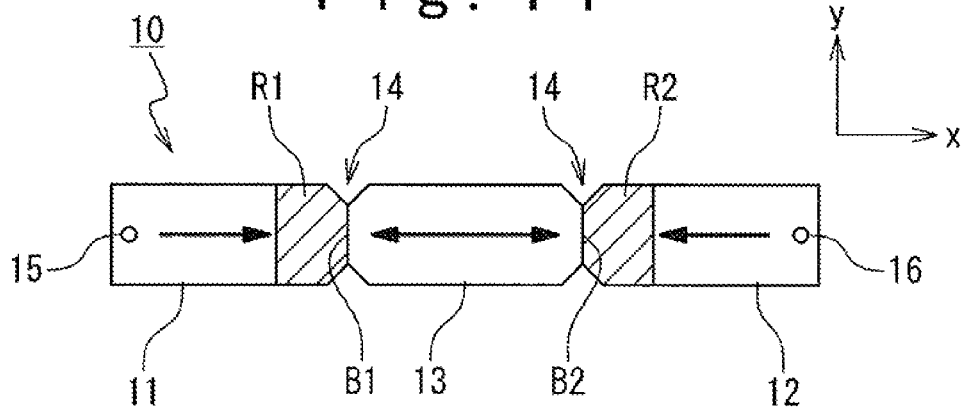
FIG. 14 is a plan view showing still another modification example of a structure of the magnetic recording layer.

FIG. 14 shows still another modification example of the magnetic recording layer 10. In FIG. 14, the magnetization fixed regions 11 and 12, the magnetization switching region 13, the damping regions R1 and R2 are "linearly" formed. The first damping region R1 is provided between the first magnetization fixed region 11 and the first boundary B1 of the magnetization switching region 13. The first magnetization fixed region 11 is connected to the magnetization switching region 13 through the first damping region R1. Also, the second damping region R2 is provided between the second magnetization fixed region 12 and the second boundary B2 of the magnetization switching region 13. The second magnetization fixed region 12 is connected to the magnetization switching region 13 through the second damping region R2. The same effects can be obtained by this structure as well.

5. Configuration of MRAM

Figure 15:
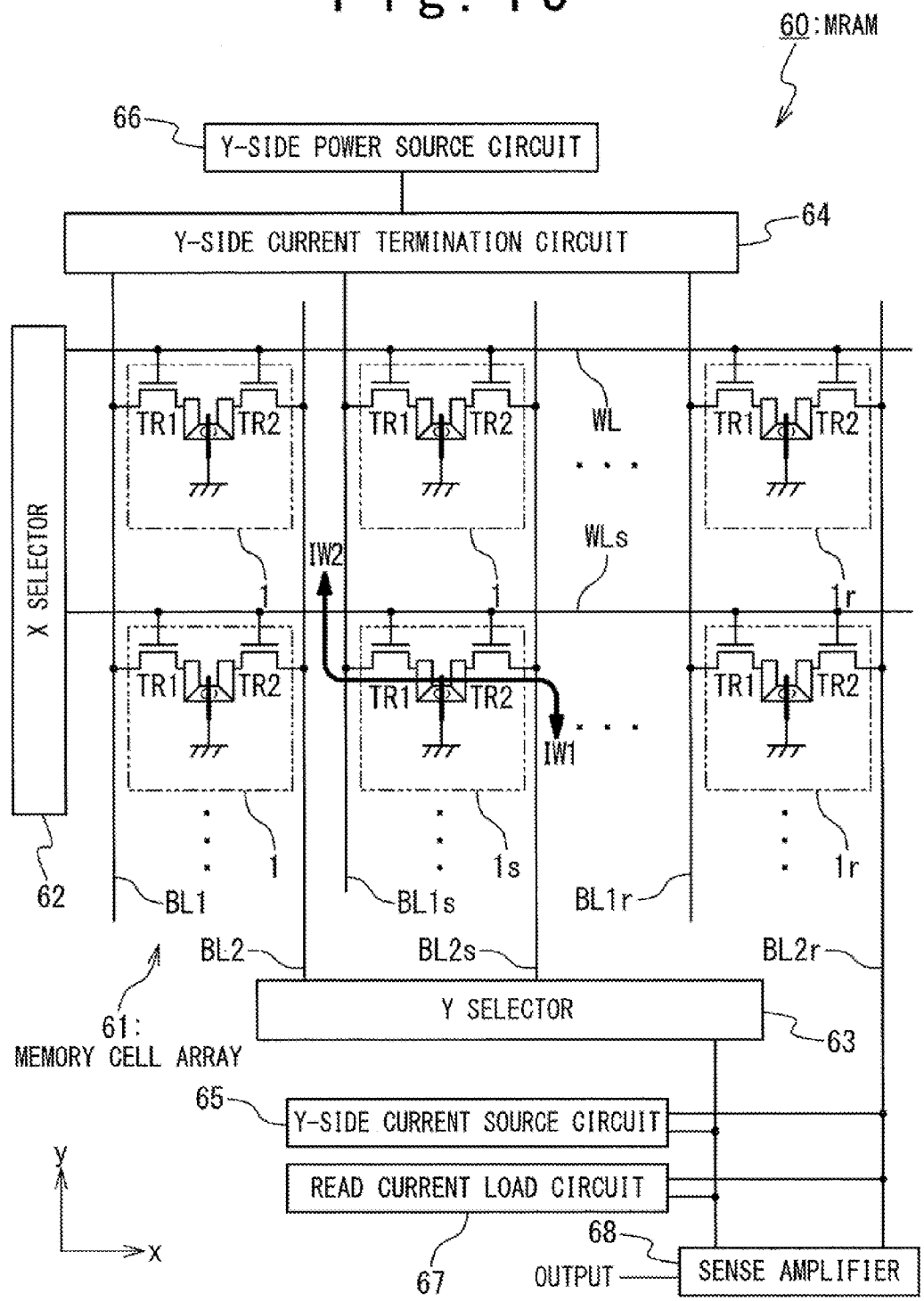
FIG. 15 is a block diagram showing one example of a configuration of an MRAM according to an exemplary embodiment of the present invention.

FIG. 15 shows one example of a configuration of an MRAM according to the present exemplary embodiment. In FIG. 15, an MRAM 60 has a memory cell array 61 in which a plurality of magnetic memory cells 1 are arranged in a matrix form. The memory cell array 61 includes not only the magnetic memory cells 1 used for the data recording but also reference cells 1r which are referred to at the time of data reading. A structure of the reference cell 1r is the same as that of the magnetic memory cell 1.

Each magnetic memory cell 1 has select transistors TR1 and TR2 in addition to the magnetoresistance element shown in FIG. 6. One of source/drain of the select transistor TR1 is connected to the current supply terminal 15 of the first magnetization fixed region 11, and the other is connected to a first bit line BL1. One of source/drain of the select transistor TR2 is connected to the current supply terminal 16 of the second magnetization fixed region 12, and the other is connected to a second bit line BL2. Gates of the select transistors TR1 and TR2 are connected to a word line WL. The pinned layer 30 of the magnetoresistance element is connected to a ground line through an electrode.

The word line WL is connected to an X selector 62. In the data writing and reading, the X selector 62 selects one word line WL connected to a target memory cell is as a selected word line WLs. The first bit line BL1 is connected to a Y-side current termination circuit 64, and the second bit line BL2 is connected to a Y selector 63. The Y selector 63 selects one second bit line BL2 connected to the target memory cell is as a selected second bit line BL2s. The Y-side current termination circuit 64 selects one first bit line BL1 connected to the target memory cell is as a selected first bit line BL1s.

A Y-side current source circuit 65 supplies or draws a predetermined write current (IW1, IW2) with respect to the selected second bit line BL2s at the time of data writing. A Y-side power source circuit 66 supplies a predetermined voltage to the Y-side current termination circuit 64 at the time of data writing. As a result, the write current (IW1, IW2) flows into the Y selector 63 or flows out from the Y selector 63. The above-mentioned X selector 62, Y selector 63, Y-side current termination circuit 64, Y-side current source circuit 65 and Y-side power source circuit 66 constitute a "write current supply circuit" for supplying the write currents IW1 and IW2 to the magnetic memory cells 1.

At the time of data reading, the first bit line BL1 is set to "Open". A read current load circuit 67 supplies a predetermined read current to the selected second bit line BL2s. Also, the read current load circuit 67 supplies the predetermined current to a reference second bit line BL2r which is connected to the reference cell 1r. A sense amplifier 68 reads data from the target memory cell is based on a difference between a potential of the reference second bit line BL2r and a potential of the selected second bit line BL2s, and outputs the read data.

The exemplary embodiments of the present invention have been described above with reference to the attached drawings. However, the present invention is not limited to the above-described exemplary embodiments and can be appropriately modified by a person skilled in the art without departing from the scope of the invention.

The invention claimed is:

1. A magnetic random access memory of domain wall motion type comprising:
   a magnetic recording layer that is a ferromagnetic layer; and
   a pinned layer connected to said magnetic recording layer through a non-magnetic layer,
   wherein said magnetic recording layer includes:
      a magnetization switching region having reversible magnetization and overlapping with said pinned layer;
      a first magnetization fixed region connected to a first boundary of said magnetization switching region and whose magnetization direction is fixed to a first direction; and a second magnetization fixed region connected to a second boundary of said magnetization switching region and whose magnetization direction is fixed to a second direction, wherein strength of damping of spin precession is represented by a damping coefficient, and said damping coefficient in at least a portion of said first magnetization fixed region and said second magnetization fixed region is larger than said damping coefficient in said magnetization switching region, wherein the magnetic random access memory further comprises a non-magnetic metal layer provided adjacent to said at least portion, and wherein said non-magnetic metal layer is formed of at least any of Pt and Pd.

2. The magnetic random access memory according to claim 1, wherein said at least portion is in contact with said first boundary and said second boundary.

3. The magnetic random access memory according to claim 1, wherein said first magnetization fixed region and said second magnetization fixed region are formed substantially parallel to each other, wherein said magnetization switching region is so formed as to connect between said first magnetization fixed region and said second magnetization fixed region.

4. The magnetic random access memory according to claim 3, wherein said first magnetization fixed region and said second magnetization fixed region are formed such that said first direction and said second direction are the same.

5. The magnetic random access memory according to claim 3, wherein said magnetization switching region, said first magnetization fixed region and said second magnetization fixed region are linearly formed in a same plane, wherein said first direction is opposite to said second direction.

6. The magnetic random access memory according to claim 1, wherein a domain wall moves in said magnetization switching region due to a current flowing between said first magnetization fixed region and said second magnetization fixed region.

7. A magnetic random access memory of domain wall motion type comprising:

a magnetic recording layer that is a ferromagnetic layer; and a pinned layer connected to said magnetic recording layer through a non-magnetic layer, wherein said magnetic recording layer includes:

a magnetization switching region having reversible magnetization and overlapping with said pinned layer;

a first magnetization fixed region whose magnetization direction is fixed to a first direction;

a second magnetization fixed region whose magnetization direction is fixed to a second direction;

a first damping region provided between a first boundary of said magnetization switching region and said first magnetization fixed region; and a second damping region provided between a second boundary of said magnetization switching region and said second magnetization fixed region, wherein strength of damping of spin precession is represented by a damping coefficient, and said damping coefficient in said first damping region and said second damping region is larger than said damping coefficient in said magnetization switching region, wherein the magnetic random access memory further comprises a non-magnetic metal layer provided adjacent to said first damping region and said second damping region, and wherein said non-magnetic metal layer is formed of at least any of Pt and Pd.

8. A magnetic memory cell having a magnetization free layer, said magnetization free layer comprising:

a magnetization switching region having reversible magnetization;

a first magnetization fixed region connected to a first boundary of said magnetization switching region and whose magnetization direction is fixed to a first direction; and a second magnetization fixed region connected to a second boundary of said magnetization switching region and whose magnetization direction is fixed to a second direction, wherein strength of damping of spin precession is represented by a damping coefficient, and said damping coefficient in at least a portion of said first magnetization fixed region and said second magnetization fixed region is larger than said damping coefficient in said magnetization switching region, wherein the magnetization free layer further comprises a non-magnetic metal layer provided adjacent to said at least portion, and wherein said non-magnetic metal layer is formed of at least any of Pt and Pd.

9. The magnetic random access memory according to claim 1, wherein said first direction and said second direction are designed such that said first magnetization fixed region and said second magnetization fixed region serve as supply sources of electrons having different spins to said magnetization switching region.

* * * * *